(12) United States Patent
Yan et al.

(10) Patent No.: US 8,763,243 B2
(45) Date of Patent: Jul. 1, 2014

(54) FABRICATION METHOD OF SUBSTRATE

(75) Inventors: Jing-Yi Yan, Taoyuan County (TW); Shu-Tang Yeh, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/525,369

(22) Filed: Jun. 18, 2012

(65) Prior Publication Data

US 2012/0258573 A1 Oct. 11, 2012

Related U.S. Application Data

(62) Division of application No. 12/424,536, filed on Apr. 15, 2009, now Pat. No. 8,222,810.

(30) Foreign Application Priority Data

Dec. 15, 2008 (TW) .............................. 97148842 A

(51) Int. Cl.
*H01L 21/56* (2006.01)

(52) U.S. Cl.
USPC .............. 29/846; 29/852; 29/829; 29/832; 174/254; 174/260

(58) Field of Classification Search
USPC .......... 29/846, 847, 852, 853, 829, 842, 854; 438/113, 463, 464; 174/254, 260, 261
See application file for complete search history.

(56) References Cited

U.S. PATENT DOCUMENTS

| | | | | |
|---|---|---|---|---|
| 4,024,627 A | * | 5/1977 | Stauffer ........................... | 438/26 |
| 5,224,023 A | * | 6/1993 | Smith et al. .................... | 361/784 |
| 5,525,760 A | * | 6/1996 | Rohatgi et al. ................. | 174/254 |
| 6,323,832 B1 | * | 11/2001 | Nishizawa et al. ............. | 345/83 |
| 6,350,387 B2 | * | 2/2002 | Caron et al. .................... | 430/314 |
| 6,395,992 B1 | * | 5/2002 | Nakayama et al. ............ | 174/254 |
| 6,974,971 B2 | * | 12/2005 | Young .............................. | 257/72 |
| 7,242,398 B2 | * | 7/2007 | Nathan et al. .................. | 345/206 |
| 7,696,005 B2 | * | 4/2010 | Iihola et al. .................... | 438/107 |
| 8,294,031 B2 | * | 10/2012 | Bagung et al. ................. | 174/254 |
| 2001/0047880 A1 | * | 12/2001 | Abbott et al. .................. | 174/254 |
| 2002/0050403 A1 | * | 5/2002 | Yasukawa et al. ............. | 174/260 |
| 2004/0070053 A1 | * | 4/2004 | Ohara ............................ | 257/618 |
| 2004/0118595 A1 | * | 6/2004 | Flammer et al. ............... | 174/254 |

(Continued)

FOREIGN PATENT DOCUMENTS

| TW | I229222 | 3/2005 |
|---|---|---|
| TW | 200844924 | 11/2008 |

OTHER PUBLICATIONS

"Office Action of Taiwan Counterpart Application", issued on Mar. 27, 2013, p. 1-p. 6.

*Primary Examiner* — Peter DungBa Vo
*Assistant Examiner* — Kaying Kue
(74) *Attorney, Agent, or Firm* — Jianq Chyun IP Office

(57) ABSTRACT

A fabricating method of a substrate board is provided. The substrate board includes a substrate having rigid areas and flexible areas, and at least an electronic component disposed on the substrate, wherein each of the rigid areas is thicker than the flexible areas. A patterned high-extensive material may be additionally disposed on the substrate to improve reliability thereof. The rigid areas and the flexible areas may be formed by molds or cutters. By using an above structure, the electronic component is less affected when the substrate is under stress, so that good characteristics are maintained.

6 Claims, 17 Drawing Sheets

(56) References Cited

U.S. PATENT DOCUMENTS

| | | | |
|---|---|---|---|
| 2004/0124763 A1* | 7/2004 | Nathan et al. | 313/498 |
| 2005/0151197 A1 | 7/2005 | Takechi | |
| 2005/0190531 A1* | 9/2005 | Gall et al. | 361/600 |
| 2006/0204675 A1* | 9/2006 | Gao et al. | 428/1.1 |
| 2008/0093110 A1* | 4/2008 | Bagung | 174/254 |
| 2010/0112295 A1* | 5/2010 | Roy | 428/172 |
| 2010/0193223 A1* | 8/2010 | Bagung et al. | 174/254 |

* cited by examiner

FABRICATION METHOD OF SUBSTRATE

CROSS-REFERENCE TO RELATED APPLICATION

This application is a divisional application of and claims priority benefit of a U.S. application Ser. No. 12/424,536, filed on Apr. 15, 2009, now U.S. Pat. No. 8,222,810, issued on Jul. 17, 2012. This application also claims the priority benefit of Taiwan application serial no. 97148842, filed Dec. 15, 2008. The entirety of the above-mentioned patent applications are hereby incorporated by reference herein and made a part of specification.

BACKGROUND OF THE INVENTION

1. Field of the Invention

The present invention relates to a substrate board. More particularly, the present invention relates to a flexible substrate board, a fabrication method thereof and a display using the same.

2. Description of Related Art

For a flexible electronic product or a flexible display, components such as electronic components with stable characteristics therein are indispensable. However, regardless of fabricating by a high-extensive or a low-ductility material, after the electronic device is elongated for a long time, it can be cracked due to an elastic fatigue thereof. Such phenomenon is a great problem for applications of the flexible electronic product and the flexible display.

Presently, a solution of the above problem is based on a material substitution method. For example, a material with high ductility is applied to the electronic device to slow down a shifting of the characteristic of the electronic device during the elongation process. According to the above material substitution method, a silicon material is, for example, substituted by an organic semiconductor, silicon oxide or silicon nitride is substituted by an organic insulation layer, and a vacuum thin-film process is substituted by a metal solution process, etc. However, the characteristic of the electronic device is still slowly changed during the elongation process and cannot be stable, so that a solution thereof is still required.

A U.S. Patent No. 2006/0204675 discloses a method to implement a rigid area and a flexible area by combining different materials. Referring to FIG. 1A, FIG. 1A is a cross-sectional view of a flexible substrate board fabricated according to the U.S. Patent No. 2006/0204675. The substrate board 100 is composed of different materials, and includes a rigid area 110 composed by a rigid material and a flexible area 120 composed by a flexible material, wherein a pixel 130 is disposed on the rigid area 110. Such substrate is fabricated by using a coextrusion roller. FIG. 1B is a schematic diagram of the coextrusion roller. First, a manifold 140 provides a multi-section layer 150 having the rigid area 110 and the flexible area 120 shown in FIG. 1A. The multi-section layer 150 is extruded by rollers 160, 162 and 164 and is combined to a substrate 170 having the pixel 130 or other circuit devices to form the aforementioned flexible substrate board. According to such method, the flexible characteristic of the substrate board can be achieved base on a difference of the material characteristics. However, during the extrusion process, the devices on the substrate 170 have to be accurately aligned to the rigid area 110 or the flexible area 120 with totally different characteristics, which may lead to a great difficulty for the fabrication process. Therefore, the method is not widely applied.

Moreover, a U.S. Patent No. 2008/0002118 and a U.S. Patent No. 2008/0053604 respectively disclose a flexible substrate board, in which a substrate and a flexible substrate are combined according to a gluing method, so as to achieve the flexibility.

In addition, a U.S. Patent No. 2005/0259189, a U.S. Patent No. 2007/0052670, a U.S. Patent No. 2006/0132025 and a U.S. Pat. No. 6,710,841 respectively disclose a flexible substrate board, in which the flexibility is achieved based on the difference of the material characteristics or a difference of thickness of a plurality of substrates.

In the aforementioned related techniques, different materials with different characteristics are applied to achieve the flexibility of the substrate board, which all have difficulties and problems in application.

SUMMARY OF THE INVENTION

The present invention is directed to a substrate board, which can achieve a flexible characteristic according to a structural difference by using a same material.

The present invention provides a substrate board including at least a rigid area and at least a flexible area, wherein the rigid area is thicker than the flexible area. When the substrate board is bended, the flexible area has a relatively great deformation due to its relatively weak mechanical strength, and the rigid area has a relatively small deformation, so that better characteristics of device areas and display areas can be maintained.

The present invention provides a method for fabricating a substrate board, which can be used to fabricate the aforementioned substrate board. In an embodiment, the method can be described as follows. First, a substrate layer is provided. Next, after the substrate layer is patterned, a substrate including at least a rigid area and at least a flexible area is formed, wherein, the rigid area is thicker than the flexible area. Finally, components are fabricated on the rigid area of the substrate.

The substrate board provided by the present invention can be applied to a display, wherein the display includes a plurality of pixel areas and a plurality of lead areas, the lead areas are connected to the corresponding pixel areas according to configurations thereof, and are connected to an external signal source for transmitting signals to the corresponding pixel areas to display images. The pixel areas and the lead areas are disposed on a substrate according to a layout, wherein the substrate includes at least a rigid area and at least a flexible area, and the rigid area is thicker than the flexible area. In an embodiment, the pixel areas are disposed in the rigid area, and the lead areas are disposed in the flexible area.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
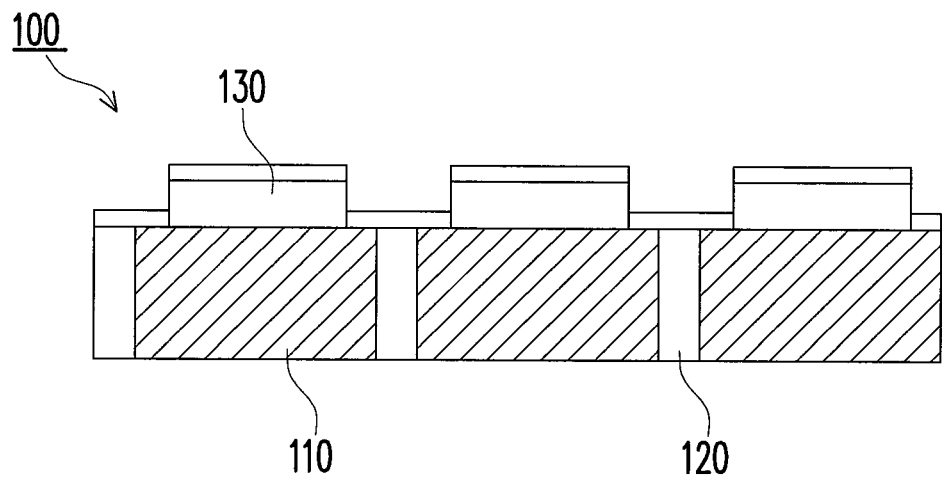
FIG. 1A is a cross-sectional view of a flexible substrate board fabricated according to a U.S. Patent No. 2006/0204675.
Figure 1B:
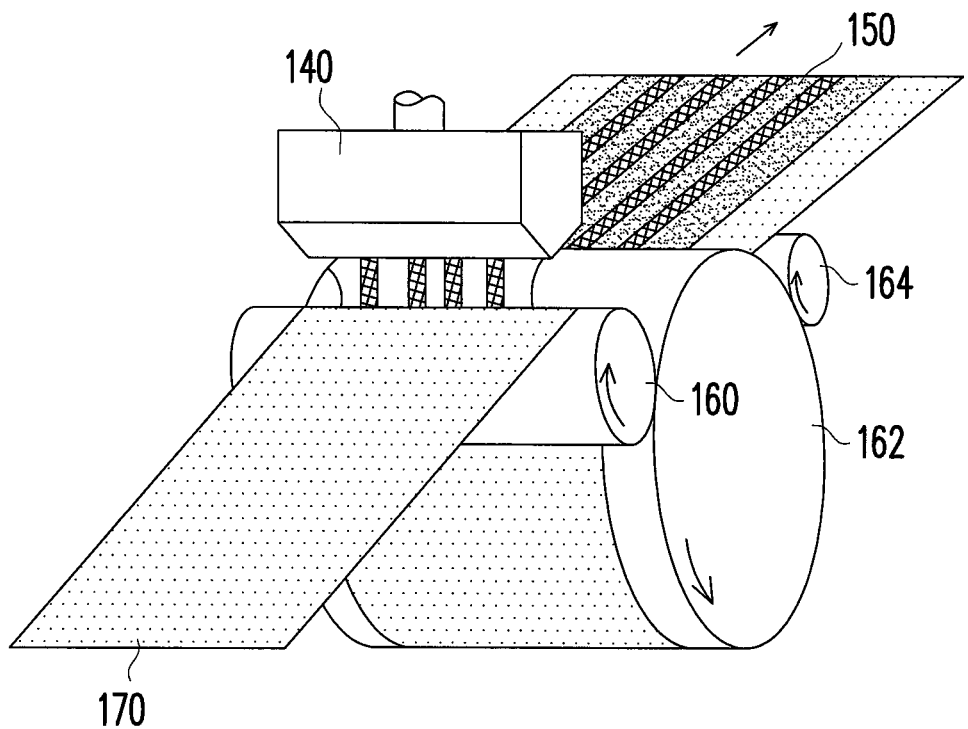
FIG. 1B is a schematic diagram of a coextrusion roller according to a U.S. Patent No. 2006/0204675.

The present invention provides a substrate board, which can achieve a flexible characteristic according to a structural difference. Since the flexible characteristic is achieved by meliorating a structure of the substrate board, and is not achieved by applying components with extensibility, variation of characteristics of the components due to elastic fatigues after the substrate board is elongated for a long time can be avoided, or even malfunction of the whole device due to crack of the components can be avoided.

The substrate board provided by the present invention includes at least a rigid area and at least a flexible area, wherein the rigid area is thicker than the flexible area. When the substrate board is bended, the flexible area has a relatively great deformation due to its relatively weak mechanical strength, and the rigid area has a relatively small deformation, so that better characteristics of device areas and display areas can be maintained.

The substrate board provided by the present invention can be formed by one or more flexible materials, and a formation thereof can be a single-layer structure or a multi-layer stacked structure in a vertical or a horizontal direction.

The present invention provided a flexible display applying the aforementioned substrate board, in which the device areas and the display areas can be disposed on the rigid area and lead areas can be disposed on the flexible region. Therefore, when the substrate board is bended, the flexible area has a relatively great deformation due to its relatively weak mechanical strength, and the rigid area has a relatively small deformation, so that the characteristics of the device areas and the display areas are not liable to be influenced when the substrate board is bended.

Therefore, according to the above design, an influence of stresses generated when the substrate board is bended can be greatly reduced. A stress interface can be design to be progressive, such as an arc distribution, a trapezoid distribution, a triangle distribution or a vertical distribution. The rigid area and the flexible area of the substrate board can be implemented by applying the same material with different thickness, so that application of a rigid material on the substrate board to increase a rigidity of the rigid area is unnecessary. Moreover, a patterned high-extensive material layer can be added to the substrate board to reinforce the flexible area probably having a problem of poor reliability due to a thin thickness thereof, and maintain an existence of the rigid area and the flexible area.

Besides, the present invention provides a method for fabricating the aforementioned substrate board. In the present embodiment, at least a relatively thick area and at least a relatively thin area are formed on a flexible substrate board, wherein the relatively thick area is the rigid area, and the relatively thin area is the flexible area. A method of forming the relatively thick area and the relatively thin area is, for example, to cut a surface of the substrate by a cutter, or the relatively thick area and the relatively thin area can be formed through a patterning process during fabrication of the substrate board, or both of the above methods can be alternately used. Moreover, the patterned high-extensive material layer can be added to the substrate board to improve a reliability of the substrate board.

Embodiments are provided below to describe a flowchart for fabricating the substrate board of the present invention.

FIG. 2A to FIG. 2E are cross-sectional views illustrating a fabrication flow of a substrate board according to an embodiment of the present invention.

Figure 2A:
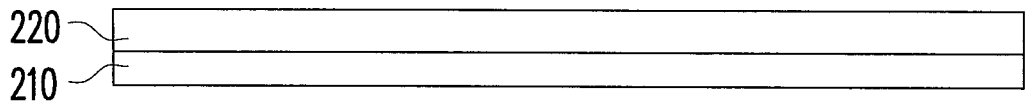
FIG. 2A to FIG. 2E are cross-sectional views illustrating a fabrication flow of a substrate board according to an embodiment of the present invention.
Figure 2B:
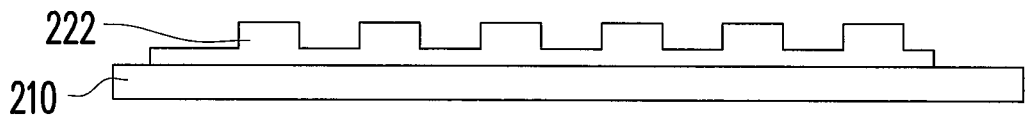
Figure 2C:
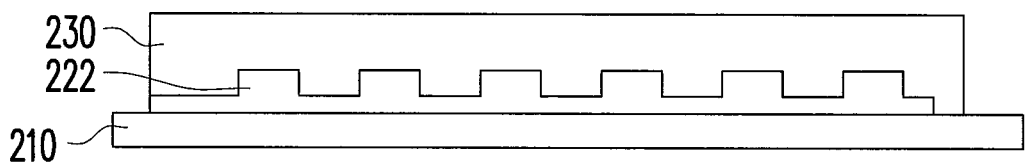
Figure 2D:
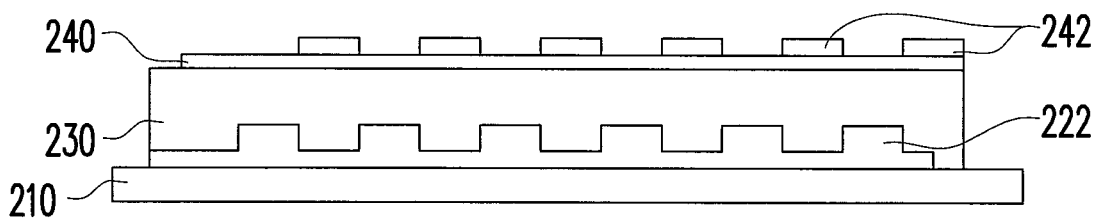
Figure 2E:
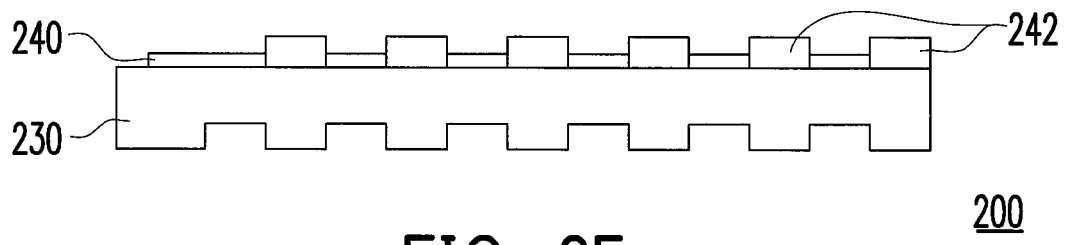

First, referring to FIG. 2A, a base 210 is provided, and a material layer 220 is formed on the base 210. Next, referring to FIG. 2B, the material layer 220 is patterned to form a patterned material layer 222, wherein a material of the material layer 220 can be an inorganic material or an organic material. Next, referring to FIG. 2C, a substrate 230 is disposed on the patterned material layer 222, and electronic components 240 and 242 are fabricated on the substrate 230, as shown in FIG. 2D. Finally, referring to FIG. 2E, the substrate 230 is separated from the base 210 and the patterned material layer 222 to form a substrate board 200.

Now, the substrate 230 of the substrate board 200 includes at least a relatively thick area and at least a relatively thin area, so that a design of sharing the stress by different thickness is achieved. The relatively thick area of the substrate 230 is the rigid area, and the relatively thin area is the flexible area, wherein the relatively thick area is at least twice the thicker than the relatively thin area.

In the present embodiment, the material layer 220 is not necessarily patterned on the base 210, but can also be patterned first to form the patterned material layer 222, and then the patterned material layer 222 is disposed on the base 210.

In the present embodiment, a sequence of the step of fabricating the electronic device 240 and 242 on the substrate 230 and the step of separating the substrate 230 from the base 210 and the patterned material layer 222 can be exchanged.

In the present embodiment, the substrate board 200 includes the electronic components 240 and 242, though the present invention is not limited thereto, and more or less electronic components can also be included.

FIG. 3A to FIG. 3E are cross-sectional views illustrating a fabrication flow of a substrate board according to an embodiment of the present invention.

Figure 3A:
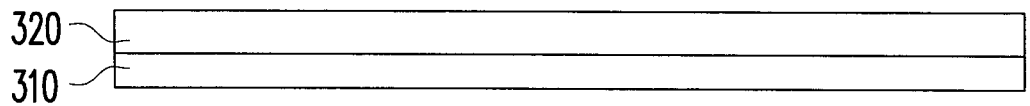
FIG. 3A to FIG. 3E are cross-sectional views illustrating a fabrication flow of a substrate board according to an embodiment of the present invention.
Figure 3B:
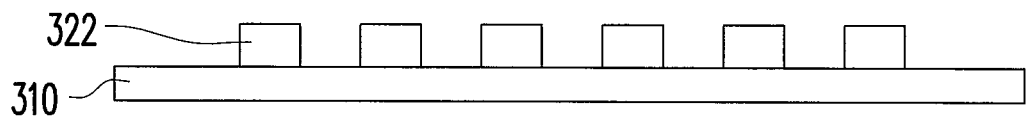
Figure 3C:
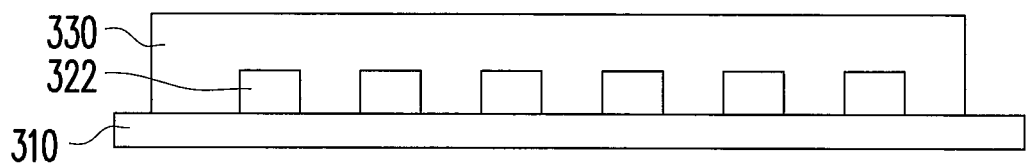
Figure 3D:
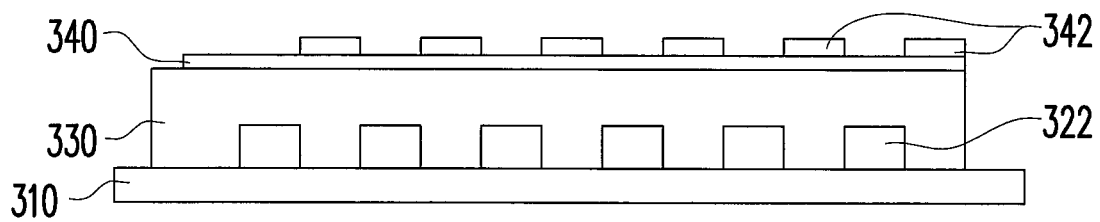
Figure 3E:
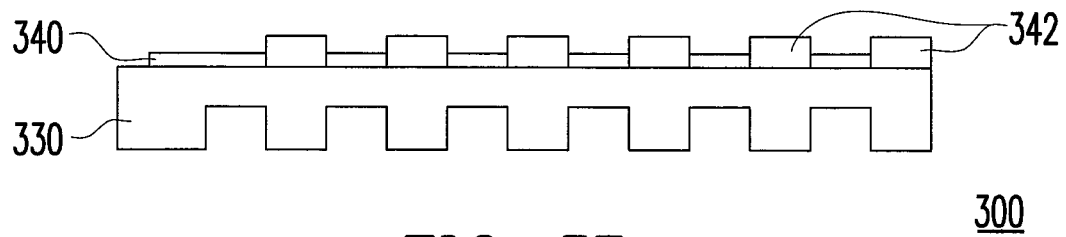

First, referring to FIG. 3A, a base 310 is provided, and a material layer 320 is formed on the base 310. Next, referring to FIG. 3B, the material layer 320 is patterned to form a patterned material layer 322, wherein a material of the material layer 320 can be an inorganic material or an organic material. Next, referring to FIG. 3C, a substrate 330 is disposed on the patterned material layer 322, and electronic components 340 and 342 are fabricated on the substrate 330, as shown in FIG. 3D. Finally, referring to FIG. 3E, the substrate 330 is separated from the base 310 and the patterned material layer 322 to form a substrate board 300.

Now, the substrate 330 of the substrate board 300 includes at least a relatively thick area and at least a relatively thin area, so that a design of sharing the stress by different thickness is achieved. The relatively thick area of the substrate 330 is the rigid area, and the relatively thin area is the flexible area, wherein the relatively thick area is at least twice the thicker than the relatively thin area.

In the present embodiment, the material layer 320 is not necessarily patterned on the base 310, but can also be patterned first to form the patterned material layer 322, and then the patterned material layer 322 is disposed on the base 310.

In the present embodiment, a sequence of the step of fabricating the electronic device 340 and 342 on the substrate 330 and the step of separating the substrate 330 from the base 310 and the patterned material layer 322 can be exchanged.

In the present embodiment, the substrate board 300 includes the electronic components 340 and 342, though the present invention is not limited thereto, and more or less electronic components can also be included.

FIG. 4A to FIG. 4E are cross-sectional views illustrating a fabrication flow of a substrate board according to an embodiment of the present invention.

Figure 4A:
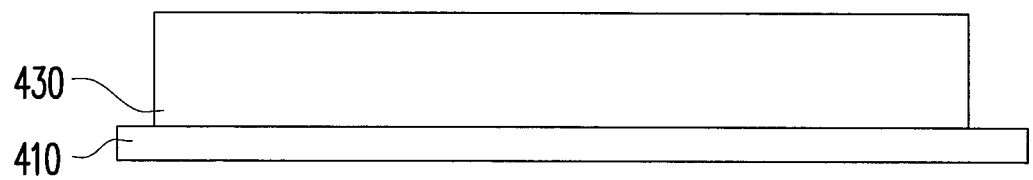
FIG. 4A to FIG. 4E are cross-sectional views illustrating a fabrication flow of a substrate board according to an embodiment of the present invention.
Figure 4B:
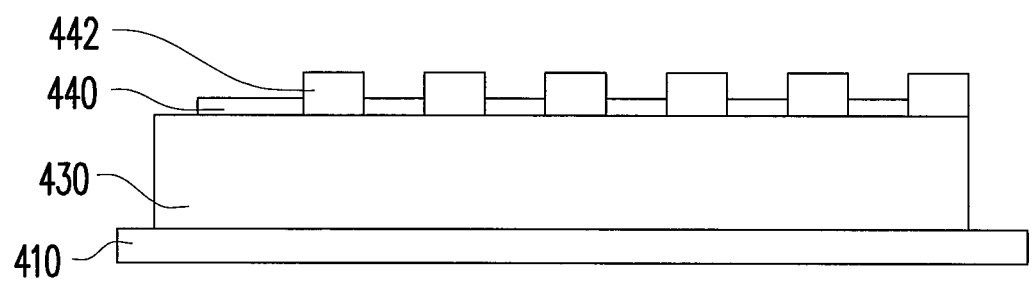
Figure 4C:
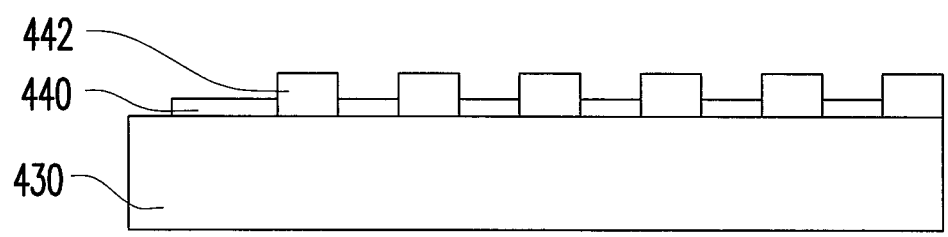
Figure 4D:
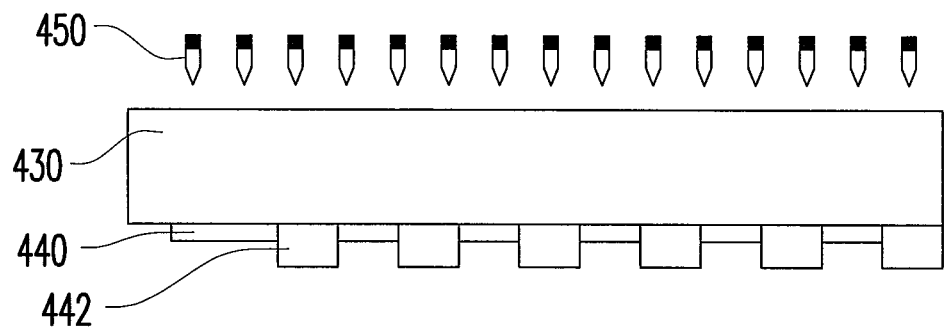
Figure 4E:
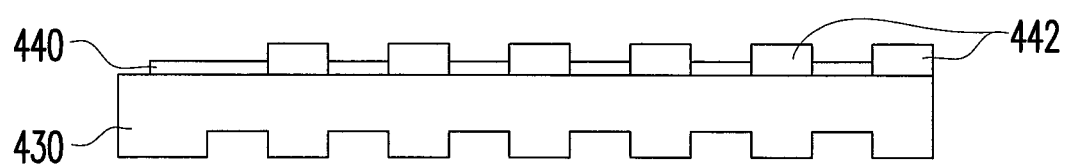

First, referring to FIG. 4A, a base 410 is provided, and a substrate 430 is formed on the base 430. Next, referring to FIG. 4B, electric devices 440 and 442 are fabricated on the substrate 430. Next, the substrate 430 is separated from the base 410, as shown in FIG. 4C. Finally, referring to FIG. 4D, a cutter 450, for example, a laser emitter or a blade is applied to cut a surface of the substrate 430 to form a relatively thick area and a relatively thin area thereon, so as to achieve a design of sharing the stress by different thickness, and form a substrate board 400, as shown in FIG. 4E. Wherein, the relatively thick area of the substrate 430 is the rigid area, and the relatively thin area is the flexible area, and the relatively thick area is at least twice the thicker than the relatively thin area.

Figure 4F:
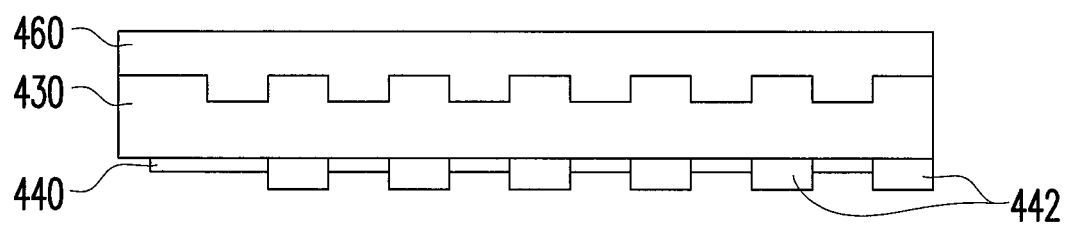
FIG. 4F is a cross-sectional view of a substrate board according to an embodiment of the present invention.

Moreover, in the present embodiment, a patterned high-extensive material layer 460 can be additionally disposed on the cut surface of the substrate 430, as shown in FIG. 4F, so as increase the reliability of the substrate board 400. A material of the patterned high-extensive material layer 460 is, for example, polyurethane, polysiloxane, polydimethylisliox-ane, ether-containing materials series, polyolefin or combinations thereof. Moreover, the patterned high-extensive material layer 460 can be only disposed on the flexible area.

In the present embodiment, a sequence of the step of fabricating the electronic components 440 and 442 on the substrate 430 and the step of cutting the surface of the substrate 430 can be exchanged. Moreover, the step of cutting the surface of the substrate 430 can be first performed, and then the step of disposing the patterned high-extensive material layer 460 is performed, and finally the step of fabricating the electronic components 440 and 442 on the substrate 430 is performed.

In the present embodiment, the substrate board 400 includes the electronic components 440 and 442, though the present invention is not limited thereto, and more or less electronic components can also be included.

FIG. 5A to FIG. 5D are cross-sectional views illustrating a fabrication flow of a substrate board according to an embodiment of the present invention.

Figure 5A:
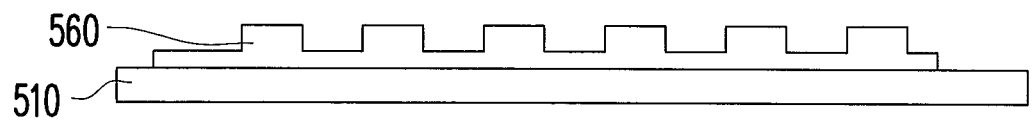
FIG. 5A to FIG. 5D are cross-sectional views illustrating a fabrication flow of a substrate board according to an embodiment of the present invention.
Figure 5B:
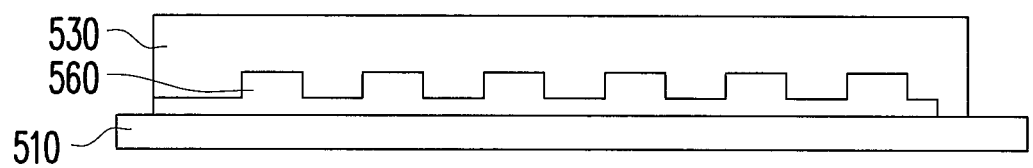
Figure 5C:
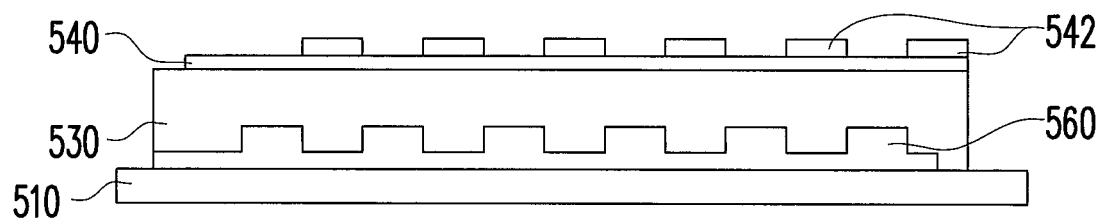
Figure 5D:
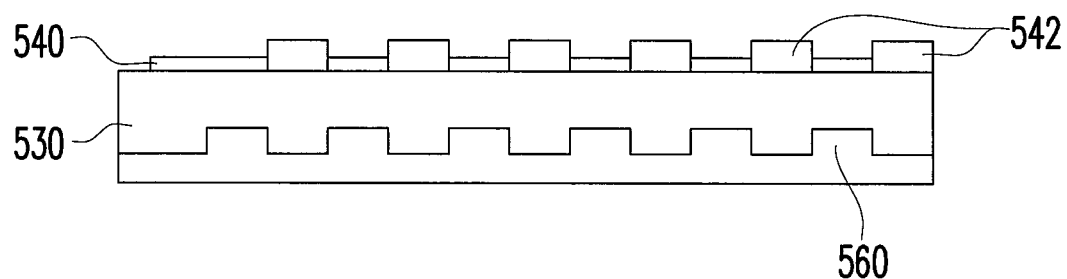

First, referring to FIG. 5A, a base 510 is provided. Next, a patterned high-extensive material layer 560 is formed on the base 510, and the patterned high-extensive material layer 560 has at least an indentation area. A material of the patterned high-extensive material layer 560 is, for example, polyurethane, polysiloxane, polydimethylislioxane, ether-containing materials series, polyolefin or combinations thereof. Next, referring to FIG. 5B, a substrate 530 is disposed on the patterned high-extensive material layer 560, wherein the substrate 530 can be only disposed in the indentation area of the patterned high-extensive material layer 560. Next, referring to FIG. 5C, electronic components 540 and 542 are fabricated on the substrate 530. Finally, the substrate 530 and the patterned high-extensive material layer 560 are separated from the base 510 to form a substrate board 500, as shown in FIG. 5D.

Now, the substrate 530 of the substrate board 500 includes at least a relatively thick area and at least a relatively thin area, so that a design of sharing the stress by different thickness is achieved. The relatively thick area of the substrate 530 is the rigid area, and the relatively thin area is the flexible area, wherein the relatively thick area in the substrate 530 is at least twice the thicker than the relatively thin area.

In the present embodiment, the high-extensive material layer is not necessarily patterned on the base 510, but can also be patterned first to form the patterned high-extensive material layer 560, and then the patterned high-extensive material layer 560 is disposed on the base 510.

In the present embodiment, the substrate board 500 includes the electronic components 540 and 542, though the present invention is not limited thereto, and more or less electronic components can also be included.

FIG. 6A to FIG. 6D are cross-sectional views illustrating a fabrication flow of a substrate board according to an embodiment of the present invention.

Figure 6A:
FIG. 6A to FIG. 6D are cross-sectional views illustrating a fabrication flow of a substrate board according to an embodiment of the present invention.
Figure 6B:
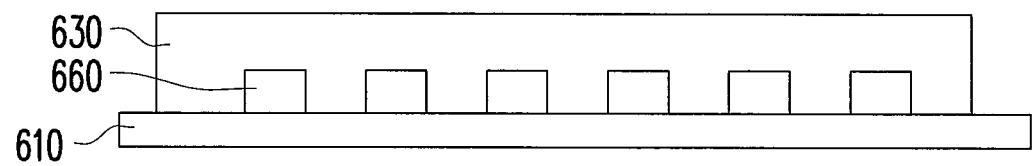
Figure 6C:
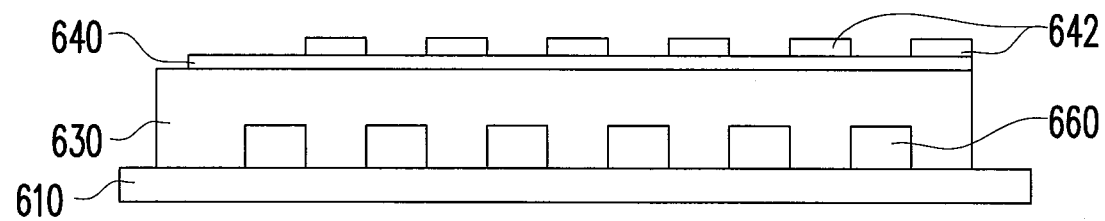
Figure 6D:
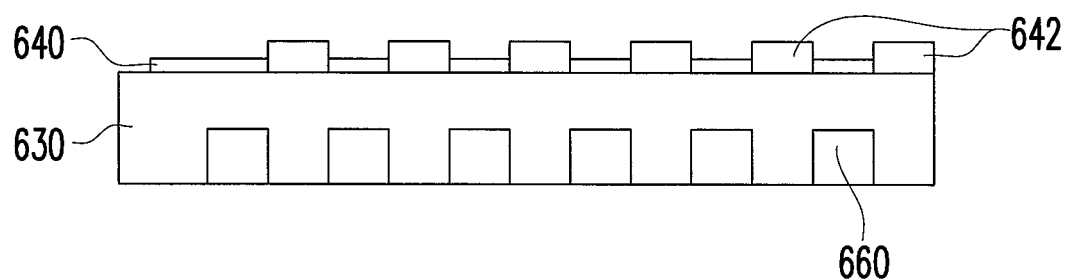

First, referring to FIG. 6A, a base 610 is provided. Next, a patterned high-extensive material layer 660 is formed on the base 610, and the patterned high-extensive material layer 660 has at least an indentation area. A material of the patterned high-extensive material layer 660 is, for example, polyurethane, polysiloxane, polydimethylislioxane, ether-containing materials series, polyolefin or combinations thereof. Next, referring to FIG. 6B, a substrate 630 is disposed on the patterned high-extensive material layer 660, wherein the substrate 630 can be only disposed in the indentation area of the patterned high-extensive material layer 660. Next, referring to FIG. 6C, electronic components 640 and 642 are fabricated on the substrate 630. Finally, the substrate 630 and the patterned high-extensive material layer 660 are separated from the base 610 to form a substrate board 600, as shown in FIG. 6D.

Now, the substrate 630 of the substrate board 600 includes at least a relatively thick area and at least a relatively thin area, so that a design of sharing the stress by different thickness is achieved. The relatively thick area of the substrate 630 is the rigid area, and the relatively thin area is the flexible area, wherein the relatively thick area in the substrate 630 is at least twice the thicker than the relatively thin area.

In the present embodiment, the high-extensive material layer is not necessarily patterned on the base 610, but can also be patterned first to form the patterned high-extensive material layer 660, and then the patterned high-extensive material layer 660 is disposed on the base 610.

In the present embodiment, the substrate board 600 includes the electronic components 640 and 642, though the present invention is not limited thereto, and more or less electronic components can also be included.

Figure 7A:
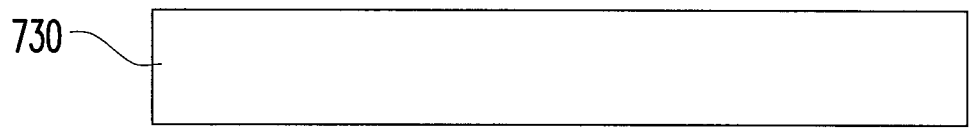
FIG. 7A to FIG. 7C are cross-sectional views illustrating a fabrication flow of a substrate board according to an embodiment of the present invention.
Figure 7B:
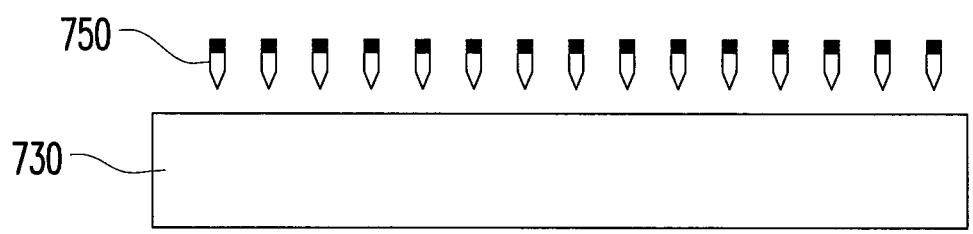
Figure 7C:
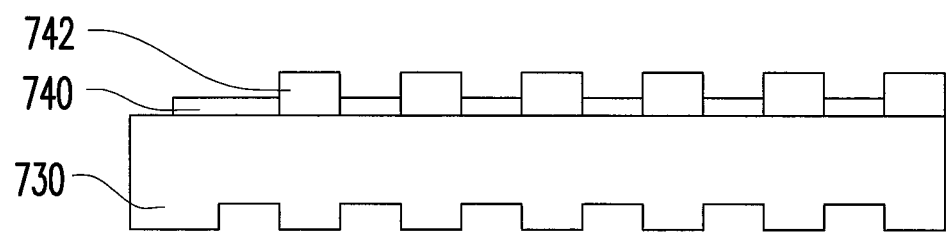

FIG. 7A to FIG. 7C are cross-sectional views illustrating a fabrication flow of a substrate board according to an embodiment of the present invention.

First, referring to FIG. 7A, a base material 730 is provided. Next, referring to FIG. 7B, a cutter 750, for example, a laser emitter or a blade is applied to cut a surface of the substrate 730 to form a relatively thick area and a relatively thin area thereon, so as to achieve a design of sharing the stress by different thickness. Next, electronic components 740 and 742 are fabricated on the substrate 730 shown as FIG. 7C to form a substrate board 700. Wherein, the relatively thick area is the rigid area, and the relatively thin area is the flexible area, and the relatively thick area of the substrate 730 is at least twice the thicker than the relatively thin area.

In the present embodiment, a sequence of the step of fabricating the electronic components 740 and 742 on the substrate 730 and the step of cutting the surface of the substrate 730 can be exchanged.

In the present embodiment, the substrate board 700 includes the electronic components 740 and 742, though the present invention is not limited thereto, and more or less electronic components can also be included.

FIG. 8A to FIG. 8D are cross-sectional views illustrating a fabrication flow of a substrate board according to an embodiment of the present invention.

Figure 8A:
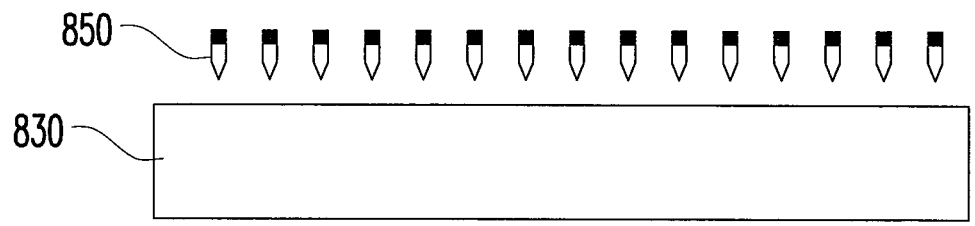
FIG. 8A to FIG. 8D are cross-sectional views illustrating a fabrication flow of a substrate board according to an embodiment of the present invention.
Figure 8B:
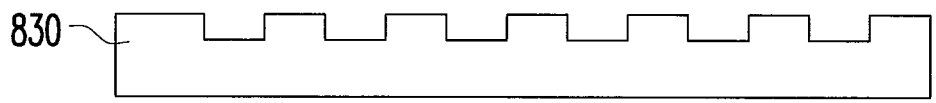
Figure 8C:
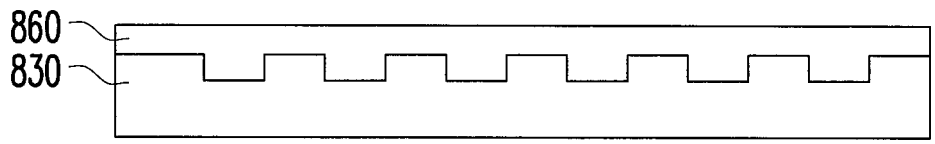
Figure 8D:
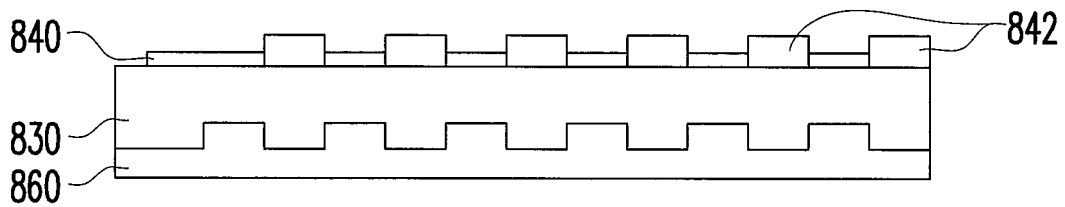

First, referring to FIG. 8A, a base material 830 is provided. Next, referring to FIG. 8B, a cutter 850, for example, a laser emitter or a blade is applied to cut a surface of the substrate 830 to form a relatively thick area and a relatively thin area thereon, so as to achieve a design of sharing the stress by different thickness. Next, referring to FIG. 8C, a patterned high-extensive material layer 860 is formed on the cut surface of the substrate 830. A material of the patterned high-extensive material layer 860 is, for example, polyurethane, polysiloxane, polydimethylislioxane, ether-containing materials series, polyolefin or combinations thereof. Next, electronic components 840 and 842 are fabricated on the substrate 830 to form a substrate board 800, as shown in FIG. 8D. Wherein, the relatively thick area of the substrate 830 is the rigid area, and the relatively thin area is the flexible area, and the relatively thick area is at least twice the thicker than the relatively thin area.

In the present embodiment, a sequence of the step of fabricating the electronic components 840 and 842 on the substrate 830 and the step of cutting the surface of the substrate 830 can be exchanged. Moreover, the step of cutting the surface of the substrate 830 can be first performed, and then the step of fabricating the electronic components 840 and 842 on the substrate 830 is performed. Finally, the step of disposing the patterned high-extensive material layer 860 is performed.

Figure 10:
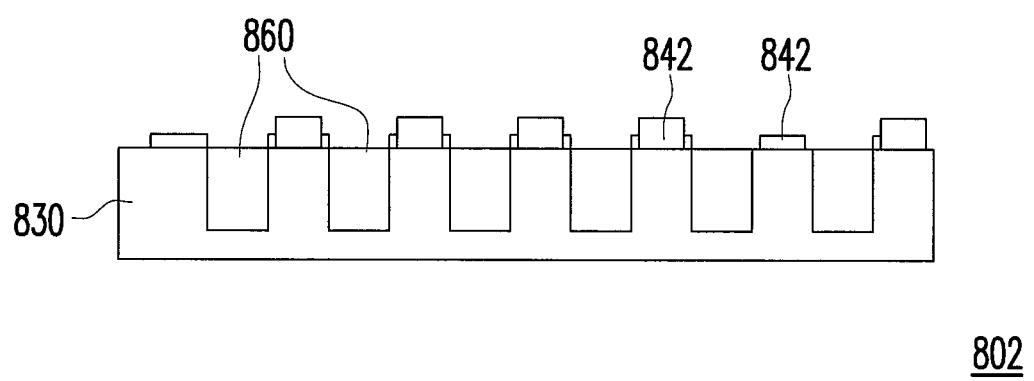
FIG. 10 is a cross-sectional view of a substrate board according to an embodiment of the present invention.
Figure 11A:
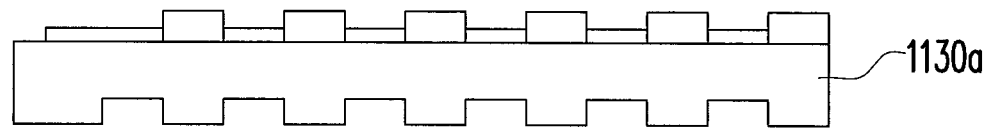
FIG. 11A to FIG. 11D are respectively cross-sectional views of a substrate board according to an embodiment of the present invention.
Figure 11B:
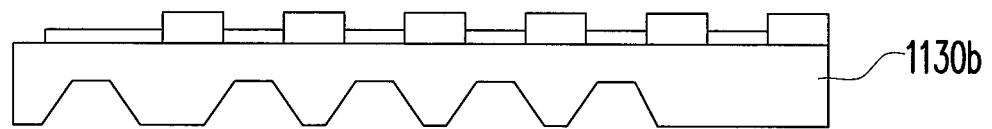
Figure 11C:
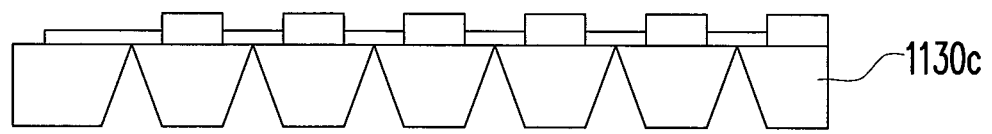
Figure 11D:
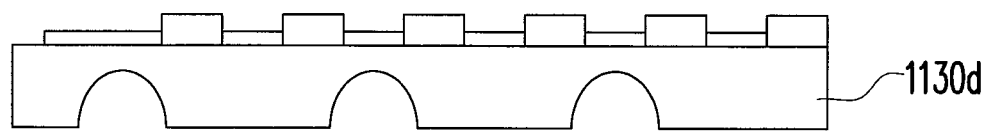

In addition, in the present embodiment, the patterned high-extensive material layer 860 can be only disposed on the relatively thin area, so as to form a substrate board 802 shown as FIG. 10 after all fabrication steps of the present embodiment are completed.

In the present embodiment, the substrate board 800 includes the electronic components 840 and 842, though the present invention is not limited thereto, and more or less electronic components can also be included.

FIG. 9A to FIG. 9D are cross-sectional views illustrating a fabrication flow of a substrate board according to an embodiment of the present invention.

Figure 9A:
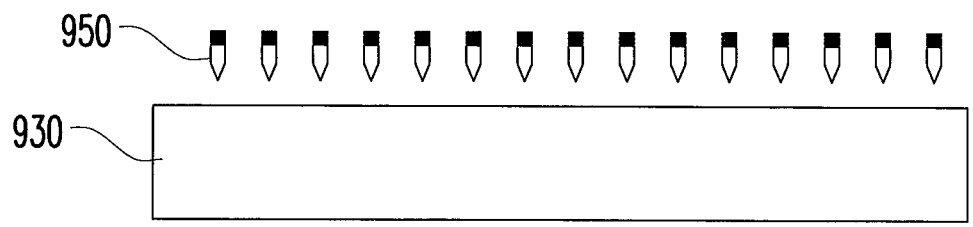
FIG. 9A to FIG. 9D are cross-sectional views illustrating a fabrication flow of a substrate board according to an embodiment of the present invention.
Figure 9B:
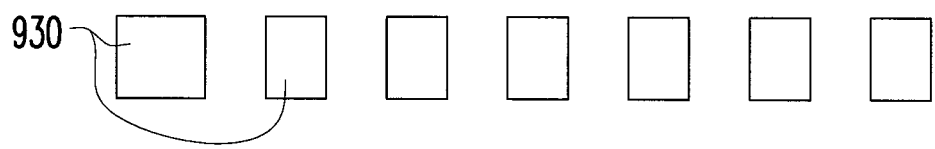
Figure 9C:
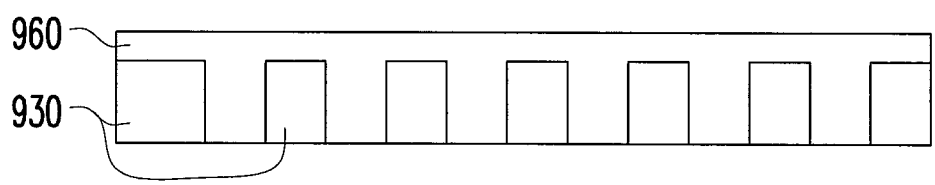
Figure 9D:
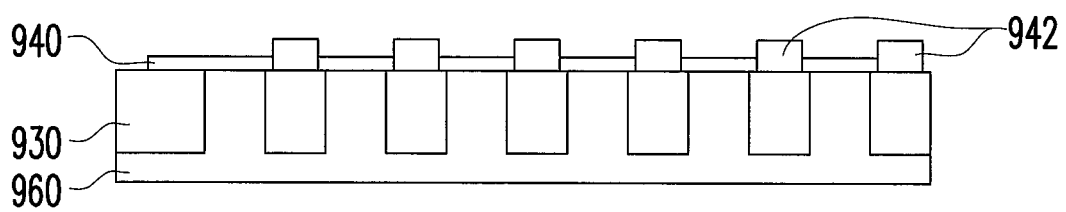

First, referring to FIG. 9A, a base material 930 is provided. Next, referring to FIG. 9B, a cutter 950, for example, a laser emitter or a blade is applied to cut a surface of the substrate 930 to pierce at least one area of the substrate 930. Next, referring to FIG. 9C, a patterned high-extensive material layer 960 is formed on the cut surface and the pierced area of the substrate 930. A material of the patterned high-extensive material layer 860 is, for example, polyurethane, polysiloxane, polydimethylislioxane, ether-containing materials series, polyolefin or combinations thereof. Next, electronic components 940 and 942 are fabricated on the substrate 930 to form a substrate board 900, as shown in FIG. 9D.

In the present embodiment, a sequence of the step of fabricating the electronic components 940 and 942 on the substrate 930 and the step of cutting the surface of the substrate 930 can be exchanged. Moreover, the step of cutting the surface of the substrate 930 can be first performed, and then the step of fabricating the electronic components 940 and 942 on the substrate 930 is performed. Finally, the step of disposing the patterned high-extensive material layer 960 is performed.

In the present embodiment, the substrate board 900 includes the electronic components 940 and 942, though the present invention is not limited thereto, and more or less electronic components can also be included.

FIG. 11A to FIG. 11D are respectively cross-sectional views of a substrate board according to an embodiment of the present invention. In the aforementioned embodiments, the substrates 230, 330, 430, 530, 630, 730, 830 and 930 can all be fabricated into shapes shown as substrates 1130a, 1130b, 1130c and 1130c, wherein the stress interface can be designed to be progressive, such as an arc distribution, a trapezoid distribution, a triangle distribution or a vertical distribution.

Figure 12A:
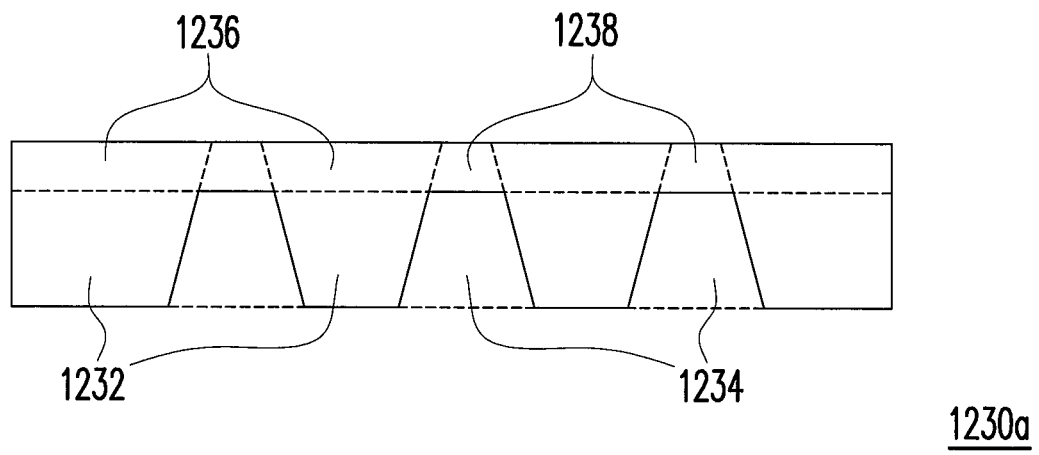
FIG. 12A and FIG. 12B are respectively cross-sectional views of a substrate according to an embodiment of the present invention.
Figure 12B:
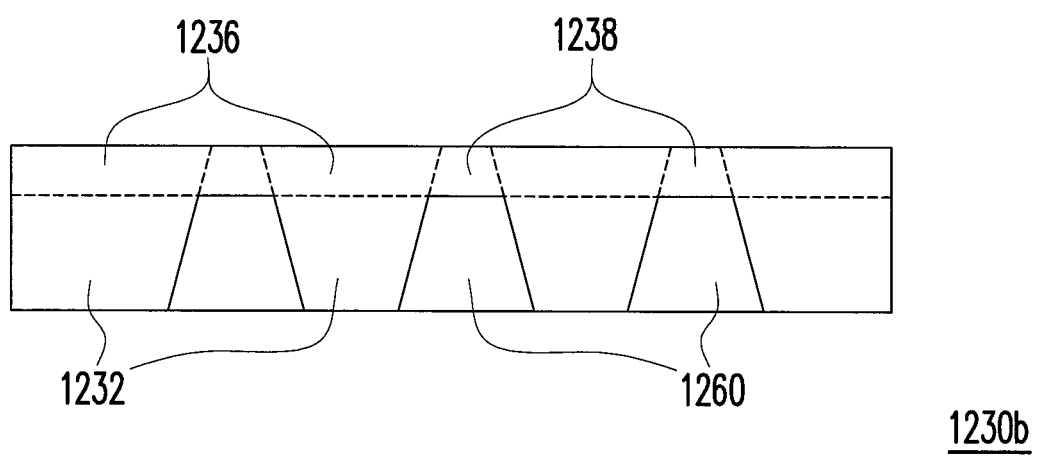

FIG. 12A and FIG. 12B are respectively a cross-sectional view of a substrate according to an embodiment of the present invention. As shown in FIG. 12A, the substrate 1230a has at least one relatively thick area composed of an area 1232 and an area 1236, and at least a relatively thin area composed of an area 1238. Since an elastic modulus of an area 1234 is approximately 0, when the substrate 1230a bears a stress, the area 1232 can resist a deformation of the area 1236, though a resistance degree thereof is decreased as positions thereof depart from an interface between the area 1232 and the area 1236, so that the deformation of the area 1236 is greater than that of the area 1232. However, as shown in FIG. 12B, if a patterned high-extensive material layer 1260 is disposed in the area 1234, and if the elastic modulus of the area 1232 is far greater than that of the patterned high-extensive material layer 1260, when the substrate 1230b bears a stress, it can be regarded as four springs are applied to absorb the stress, and the area 1232 and the patterned high-extensive material layer 1260 also participate the stress-absorption process, so that the deformation of the area 1236 can be effectively reduced.

Figure 13:
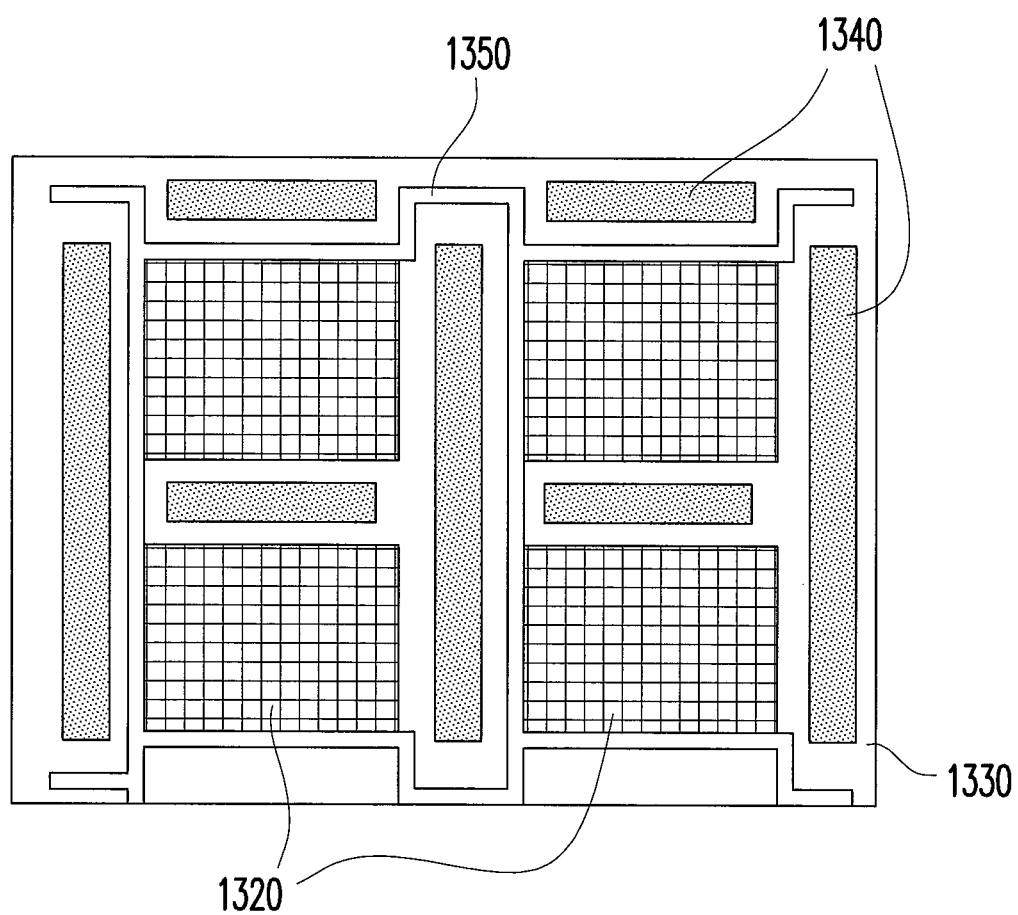
FIG. 13 is a top view of a substrate board according to an embodiment of the present invention.

Referring to FIG. 13, FIG. 13 is a top view of a substrate board according to an embodiment of the present invention.

When electronic components are fabricated on a substrate 1330, the high-extensive material can be disposed at regions outside pixel areas 1320 (including device areas and display areas) or outside lead areas 1350 to form stress-absorption areas 1340, so that the substrate under the pixel areas 1320 may have a relatively small deformation when bearing the stress, and therefore a stability and lifespan of the electronic components on the substrate can be increased.

In the present embodiment, the pixel areas, the lead areas and the stress-absorption areas respectively have a fixed number, though it is only an example, and the present invention is not limited thereto, and the numbers of the pixel areas, the lead areas and the stress-absorption areas can be more or less.

Figure 14A:
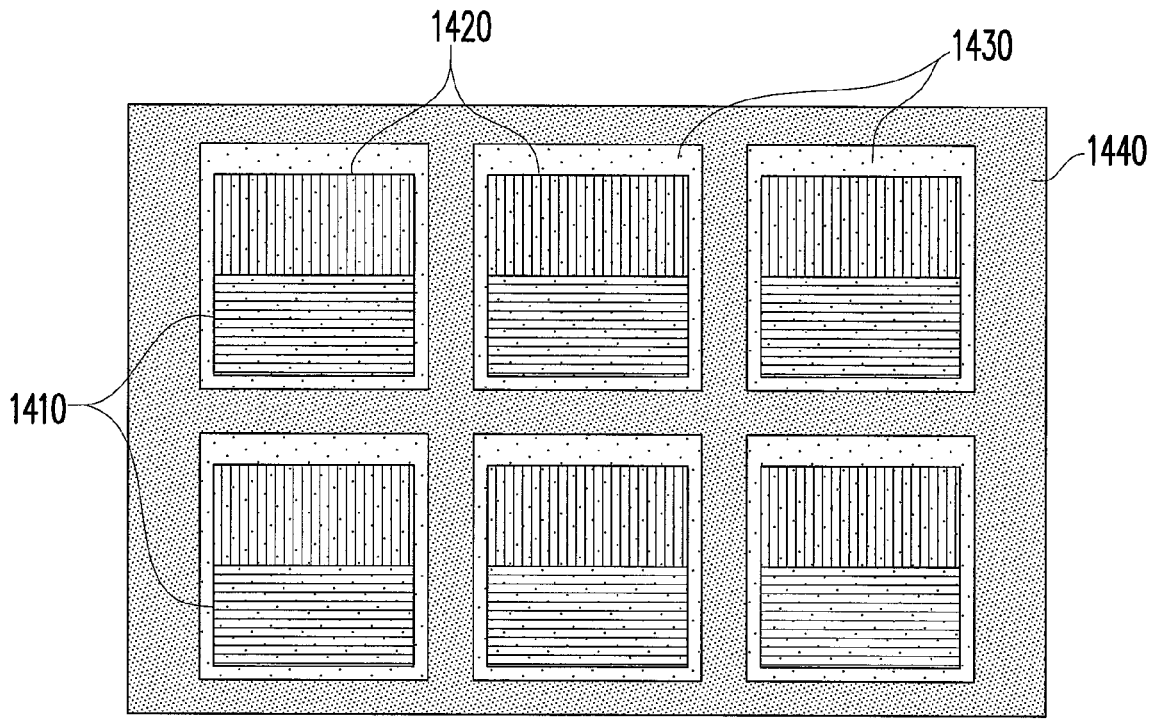
FIG. 14A and FIG. 14B are respectively top views of a substrate board according to an embodiment of the present invention.
Figure 14B:
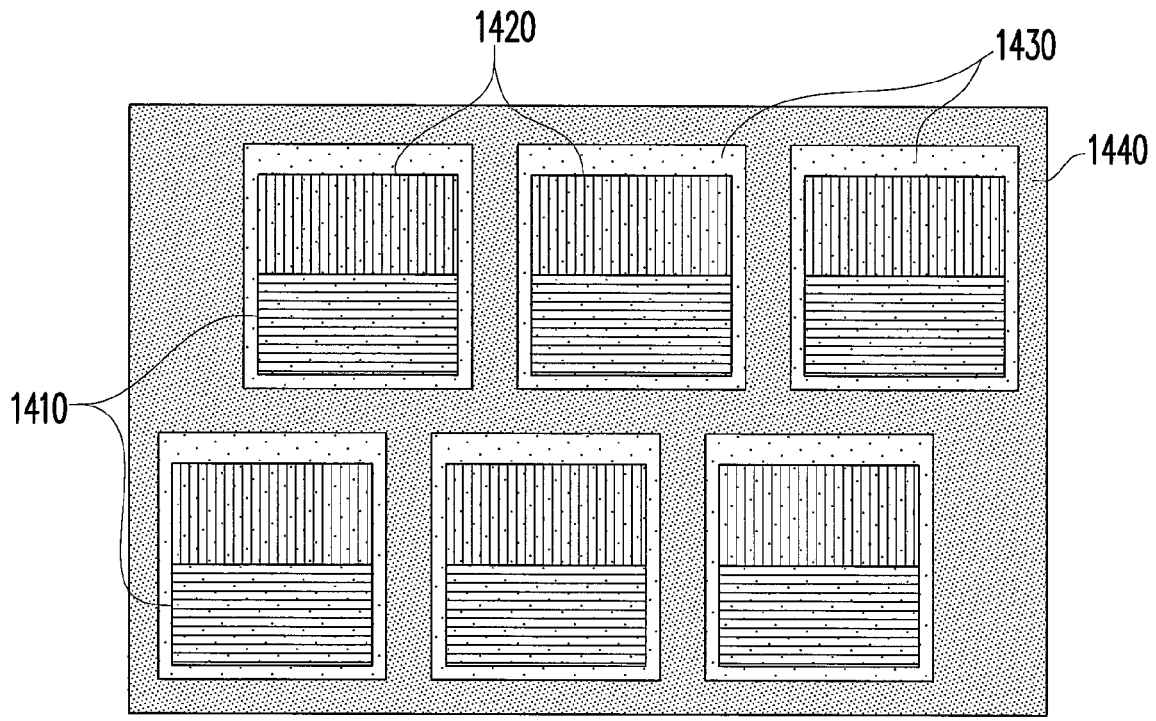

FIG. 14A and FIG. 14B are respectively a top view of a substrate board according to an embodiment of the present invention.

Considering a substrate board fabricated according to the fabrication method of the above embodiment is applied to a flexible display, when the electronic components are fabricated on the substrate, all of the pixel areas including all of device areas 1410 and display areas 1420 can be disposed on a rigid area 1430, and all of or a part of the lead areas (not shown) can be disposed on a flexible area 1440. Wherein, the pixel areas can be arranged in alignment, as shown in FIG. 14A, or can be arranged in interlace, as shown in FIG. 14B.

In the present embodiment, the pixel areas, the device areas, the display areas, the rigid area and the flexible area respectively have a fixed number, though it is only an example, and the present invention is not limited thereto, and the numbers of the pixel areas, the device areas, the display areas, the rigid area and the flexible area can be more or less.

Figure 15A:
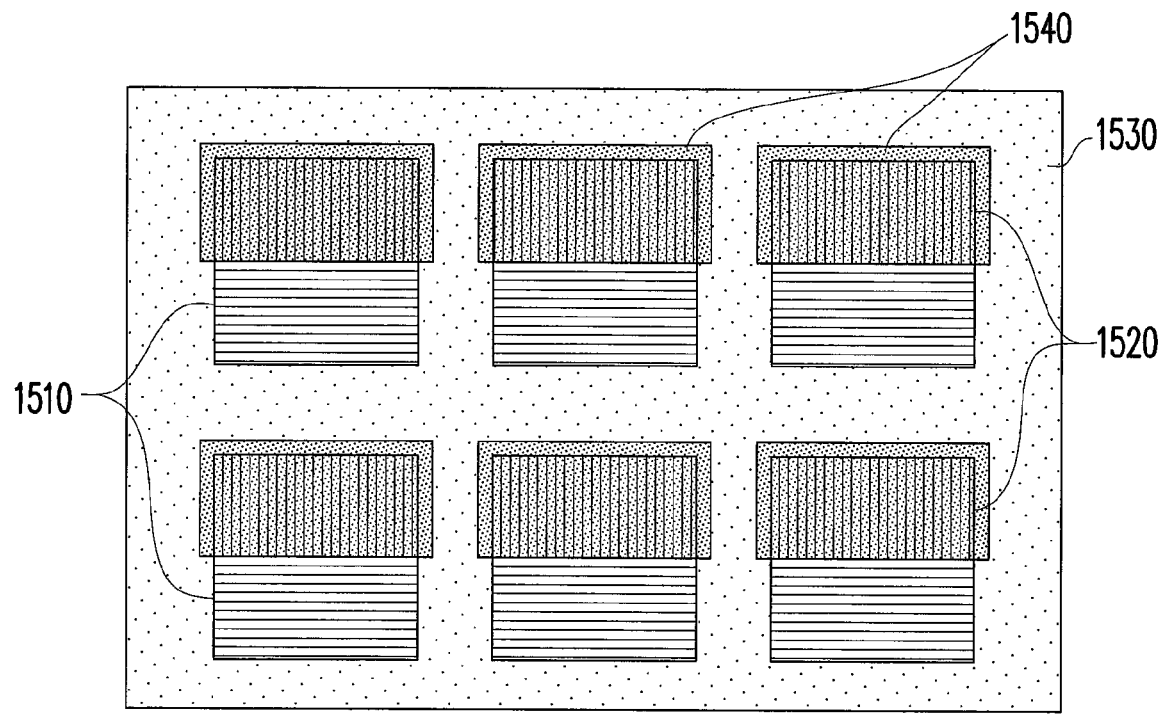
FIG. 15A to FIG. 15D are respectively top views of a substrate board according to an embodiment of the present invention.

FIG. 15A is a top view of a substrate board according to an embodiment of the present invention.

Considering a substrate board fabricated according to the fabrication method of the above embodiment is applied to a flexible display, when the electronic components are fabricated on the substrate, all of device areas 1510 can be disposed on a rigid area 1530, and all of display areas 1520 and all of or a part of the lead areas (not shown) can be disposed on flexible areas 1540. Wherein, though not illustrated in FIG. 15A, a part of the display areas 1520 can also be disposed on the rigid area 1530.

Figure 15B:
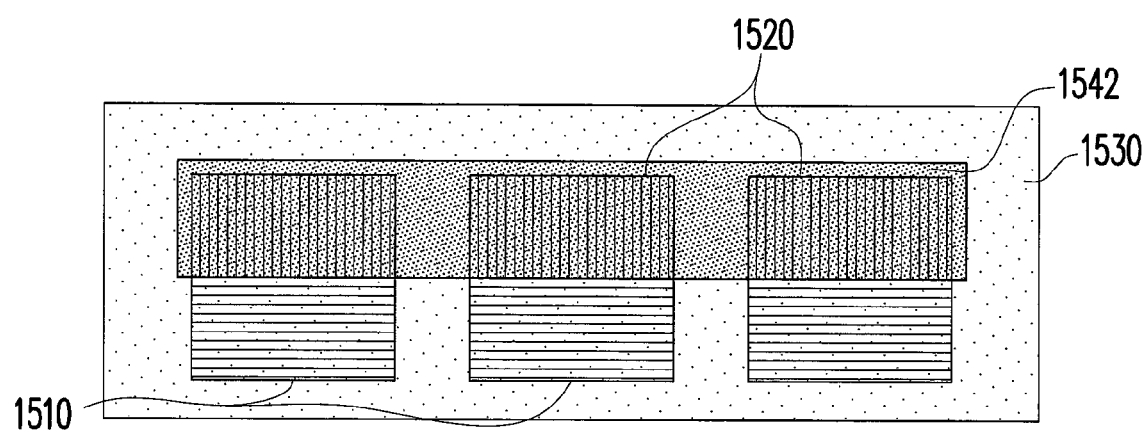

FIG. 15B is a top view of a substrate board according to an embodiment of the present invention. Moreover, the flexible areas 1540 can also be substituted by a large-area flexible area 1542.

Figure 15C:
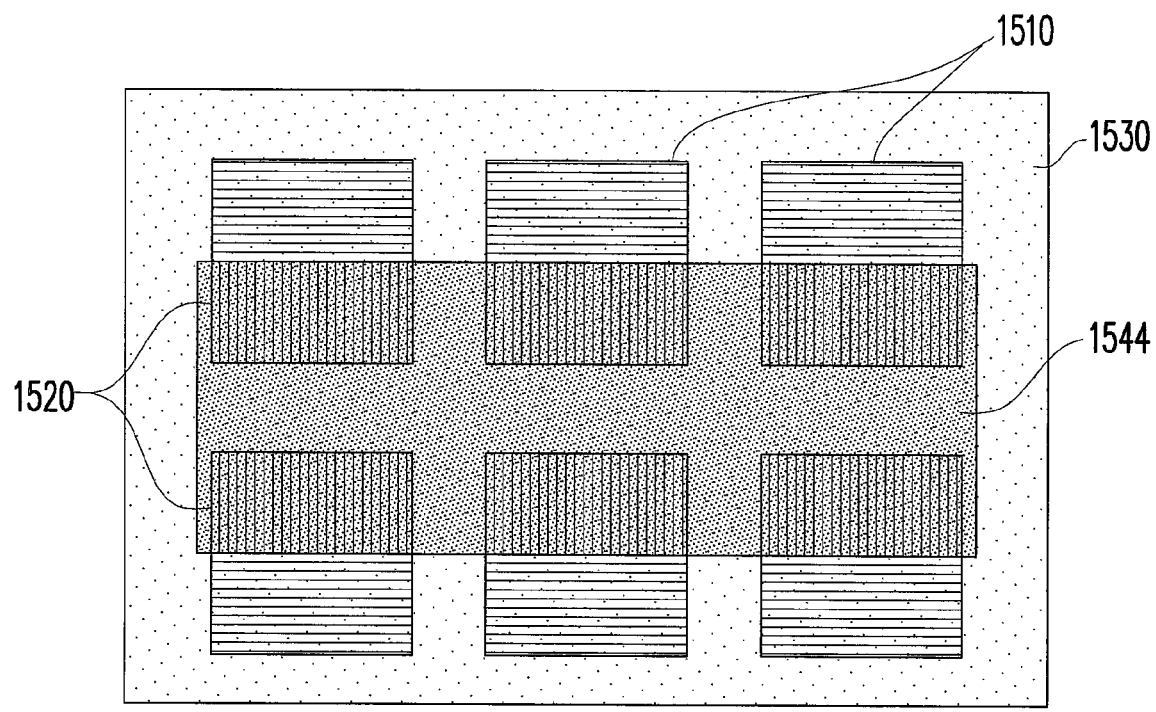
Figure 15D:
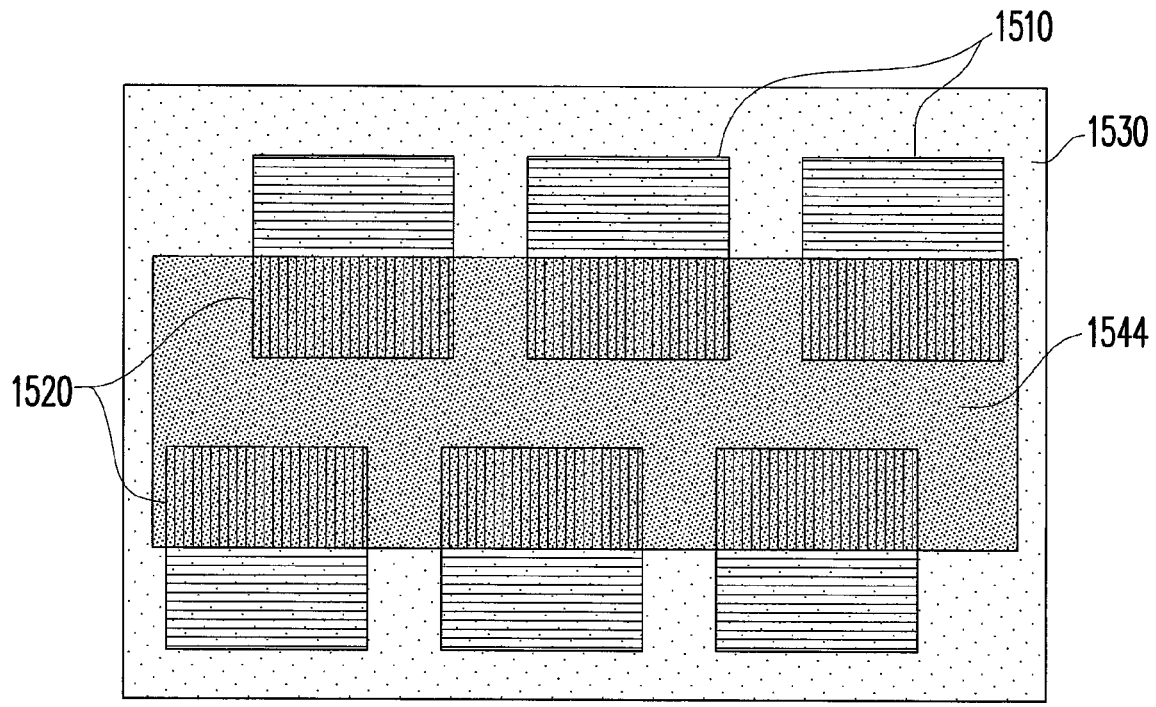

FIG. 15C and FIG. 15D are respectively a top view of a substrate board according to an embodiment of the present invention. The pixel areas can be disposed face to face in alignment, and all of or a part of the display areas 1520 are disposed on a large-area flexible area 1544. Alternatively, as shown in FIG. 15D, the pixel areas can be disposed face to face in interlace.

In the present embodiment, the pixel areas, the device areas, the display areas, the rigid area and the flexible area respectively have a fixed number, though it is only an example, and the present invention is not limited thereto, and the numbers of the pixel areas, the device areas, the display areas, the rigid area and the flexible area can be more or less.

In summary, by forming the rigid area and the flexible area on the substrate board of the present invention, when the substrate board is bended, the flexible area may have a relatively great deformation due to its relatively weak mechanical strength, and the rigid area has a relatively small deformation, so that better characteristics of the device areas and display areas can be maintained. Therefore, the influence of the stress generated due to the deformation can be greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a substrate board, comprising:
providing a substrate layer;
patterning the substrate layer to form a substrate having a first surface and a second surface opposite to the first surface and comprising at least a plurality of rigid areas and a plurality of flexible areas, wherein each of the rigid areas is thicker than the flexible areas, and the substrate further has a plurality of recesses separately distributed on the second surface so as to define the rigid areas and the flexible areas;
fabricating a plurality of electronic components on the first surface of the substrate, wherein a portion of the electronic components located in the rigid areas are thicker than the rest of the electronic components located in the flexible areas; and
forming a patterned high-extensive material layer on the second surface of the substrate,
wherein patterning the substrate layer comprises:
forming a patterned material layer;
forming the substrate layer on the patterned material layer; and
separating the substrate layer from the patterned material layer to form the rigid areas and the flexible areas on the substrate.

2. The method for fabricating a substrate board as claimed in claim 1, wherein a material of the material layer is an inorganic material or an organic material.

3. The method for fabricating a substrate board as claimed in claim 1, wherein each of the rigid areas is at least twice the thicker than the flexible areas.

4. The method for fabricating a substrate board as claimed in claim 1, wherein the step of patterning the substrate layer comprises cutting a surface of the substrate layer to form the substrate having the rigid areas and the flexible areas.

5. The method for fabricating a substrate board as claimed in claim 4, wherein in the step of cutting the surface of the substrate layer, a part of areas of the substrate layer is pierced to form holes.

6. The method for fabricating a substrate board as claimed in claim 1, wherein a material of the patterned high-extensive material layer is a material selected from a group consisting of polyurethane, polysiloxane, polydimethylislioxane, ether-containing materials series, polyolefin or combinations thereof.

* * * * *